United States Patent
Weale et al.

[11] Patent Number: 5,929,471
[45] Date of Patent: Jul. 27, 1999

[54] STRUCTURE AND METHOD FOR CCD SENSOR STAGE SELECTION

[75] Inventors: Gareth P. Weale, New Hamburg; Martin J. Kiik; Simon G. Ingram, both of Waterloo, all of Canada

[73] Assignee: Dalsa, Inc., Canada

[21] Appl. No.: 09/006,888

[22] Filed: Jan. 14, 1998

Related U.S. Application Data

[60] Provisional application No. 60/048,348, May 30, 1997.

[51] Int. Cl.⁶ .................. H01L 27/148; H01L 29/768
[52] U.S. Cl. .................. 257/236; 257/249; 257/250
[58] Field of Search .................. 257/236, 249, 257/250

[56] References Cited

U.S. PATENT DOCUMENTS

| | | |
|---|---|---|
| 3,789,267 | 1/1974 | Krambeck et al. . |
| 4,001,861 | 1/1977 | Carnes . |
| 4,099,197 | 7/1978 | Ibrahim et al. . |
| 4,118,795 | 10/1978 | Frye et al. . |
| 4,159,430 | 6/1979 | Boudewijns et al. . |
| 4,165,537 | 8/1979 | Engeler et al. ............ 365/45 |
| 4,195,273 | 3/1980 | Prince .............. 333/165 |
| 4,280,141 | 7/1981 | McCann et al. . |
| 4,328,432 | 5/1982 | Yamazaki . |
| 4,382,267 | 5/1983 | Angle . |
| 4,426,664 | 1/1984 | Nagumo et al. . |
| 4,430,673 | 2/1984 | Salomon et al. . |
| 4,679,212 | 7/1987 | Hynecek . |
| 4,782,394 | 11/1988 | Hieda et al. . |
| 4,849,814 | 7/1989 | Van De Steeg . |
| 4,954,900 | 9/1990 | Frame . |
| 4,974,043 | 11/1990 | Stevens . |
| 5,111,237 | 5/1992 | Cazaux . |
| 5,140,623 | 8/1992 | Imai et al. ............ 377/60 |
| 5,196,939 | 3/1993 | Elabd et al. . |
| 5,264,939 | 11/1993 | Chang . |
| 5,272,535 | 12/1993 | Elabd . |
| 5,442,208 | 8/1995 | Bosiers et al. . |
| 5,491,512 | 2/1996 | Itakura et al. . |
| 5,510,836 | 4/1996 | Stekelenburg . |
| 5,614,740 | 3/1997 | Gardner et al. . |
| 5,796,801 | 8/1998 | Nakashiba ............ 377/60 |

FOREIGN PATENT DOCUMENTS 5-37861  2/1993  Japan .

*Primary Examiner*—Ngân V. Ngô
*Attorney, Agent, or Firm*—Banner & Witcoff, Ltd.

[57] ABSTRACT

A control structure for stage selection in a CCD sensor includes a well formed in a substrate and a channel formed in the well, the channel defining a channel direction. A bus structure is disposed over the channel and oriented transversely to the channel direction, the bus structure including a plurality of uniformly spaced register element sets. The plurality of uniformly spaced register element sets includes a first register element set and a plurality of remaining register element sets. The first register element set includes a first clock signal conductor and at least one other clock signal conductor. Each set of the plurality of remaining register element sets includes a first clock signal conductor and at least one other clock signal conductor. The control structure further includes a connection structure to couple together the first clock signal conductor of each of the plurality of remaining register element sets while the first clock signal conductor of the first register element set is electrically isolated from the first clock signal conductor of each of the plurality of remaining register element sets. The connection structure further couples each clock signal conductor of the at least one other clock signal conductor of the first register element set to respective clock signal conductors of each set of the plurality of remaining register element sets.

18 Claims, 6 Drawing Sheets

STRUCTURE AND METHOD FOR CCD SENSOR STAGE SELECTION

The priority benefit of the filing date of Ser. No. 60/048, 348 filed on May 30, 1997 is hereby claimed.

BACKGROUND OF THE INVENTION

1. Field of the Invention

The present invention relates to stage selection in a CCD imaging sensor. In particular, the invention relates to use of a dual function clock conductor in the clocking structure to mechanize one of a clocking mode and a shunt mode to achieve stage selection.

2. Description of Related Art

Charge coupled devices (hereinafter CCDs) are widely used in video imaging and recording applications. For example, the architecture of a CCD video sensor may follow the form dictated by the National Television Standards Committee (NTSC) for video broadcast standards. Such CCD video sensor designs need at least 488 TV lines vertically, 500 to 800 pixels per TV line, have an optical format of 4/3 aspect ratio, and generate field interlaced video at a frame rate of 30 Hz. CCD architectures which achieved the goals of the video format imaging requirements generally fall into two categories: Interline Transfer (ILT) or Frame Transfer (FT) image sensors.

An alternative application of a CCD sensor is industrial inspection or vision equipment. The architecture of a CCD video sensor for this application may be optimized for maximum pixel resolution, or to max image frame rate, or both. Often inspection cameras used to inspect moving objects (e.g., on a continuous conveyor belt or rolled goods such as rolls of cloth) employ a line scan CCD sensor where a linear CCD sensor is oriented in a direction perpendicular to the direction of movement of the object being imaged. Advanced linear CCD sensors often employ a time delay and integrate technology and are referred to as TDI CCD sensors.

In FIG. 7, known frame transfer sensor 10 includes imaging section 2 coupled to storage section 4. Frame transfer sensors rely on the quick transfer of image field data from an array of photo-sensitive photo-sites in imaging section 2 where photo-charge is integrated (i.e., the imaging section) to an optically opaque analog storage array (i.e., storage section 4), and the subsequent parallel to serial transfer of the video data through horizontal CCD readout shift register 6 (HCCD shift register) through output node structure 7, through buffer 8 to a camera circuit. An optically opaque storage array is a storage array that is covered by an optically opaque material such as an aluminum film so that the storage array is not photo-sensitive. The rapid vertical transfer of the image data from integration of the first video field is vital since the optical input onto the imaging section of the CCD sensor is continuous (not strobed or modulated during transfer).

In FIG. 8, known interline transfer CCD image sensor 20 (i.e., an ILT CCD sensor) includes imaging section 12 in a plurality of columns of photo-sites, each column disposed adjacent to an optically opaque interline transfer register 14 (e.g., covered with aluminum to render the transfer register insensitive to optical input). An ILT CCD sensor generally has no optically opaque storage section as does the frame transfer sensor. In an ILT CCD sensor, optical input is integrated in photo-sites 12 and then transferred to interline transfer registers 14. Then, during the integration of the next field of data, the field of image data in interline transfer registers 14 are parallel to serial transferred through horizontal CCD shift register 16 (HCCD shift register) through output node structure 17, through buffer 18 to a camera circuit.

In FIG. 9, known time delay and integrate (TDI) linear array sensor 30 includes imaging section 22 as in a frame transfer sensor, but the imaging section is generally coupled directly to horizontal CCD readout shift register 26, and from there through output node structure 27, through buffer 28 to a camera circuit. Imaging section 22 includes a plurality of columns, each column including a plurality of photo-sites. In operation, a camera lens focuses the image on the TDI CCD sensor. The image, that is the optical input to the TDI CCD sensor, is moving (e.g., on a conveyor belt). An image conjugate focused on the sensor appears to be moving. A portion of the image first appears on one pixel of the TDI CCD sensor, and then appears on another pixel of the sensor. The camera and sensor are arranged so that a portion of the moving image moves in a direction from the top of a column of photo-sites to the bottom of the column. The TDI CCD sensor is clocked to transfer charge down the columns of photo-sites at a rate equal to the rate that the portion of the image moves down the column. Charge generated at a first photo-site is transferred to the next photo-site at the same time that the image portion that generated the charge at the first photo-site moves to the next photo-site. In this way photo-charge is accumulated at the photo-site under the image portion as the image portion moves down the column. Thus the name, time delay and integrate (TDI).

Two-dimensional imaging arrays (e.g., in frame transfer sensors and in interline transfer sensors) generally take a snap shot of an image. The whole photoactive array of pixels integrates photo-charge for a period of time. At the end of the integration time, the information is transferred from the sensor to an external circuit element using a parallel to serial transfer scheme. Each horizontal line of pixel data is transferred into a horizontal CCD readout shift register. The line of data is then transferred serially through an output node structure at the end of the register and then through a buffer amplifier.

Similarly, in a TDI CCD sensor, the last pixel in each integrating column of photo-sites (i.e., the last horizontal line) is transferred into a horizontal CCD readout shift register. The line of data is then transferred serially through an output node structure at the end of the register and then through a buffer amplifier.

In TDI CCD sensors, it is sometimes desirable to adjust the responsivity of the sensor to the brightness of the light illuminating the scene being imaged. In applications of two-dimensional imaging arrays (e.g., in frame transfer sensors and in interline transfer sensors) it is sometimes desirable to provide a reduced format sensor (i.e., only the lower half or quarter of the image area is output).

SUMMARY OF THE INVENTION

It is an object to the present invention to provide a structure to achieve stage selection within the format of uniformly spaced clocking conductors. It is a further object of the present invention to provide means for programmable responsivity for a TDI CCD sensor. It is yet another object of the present invention to provide means for programmable format size for a frame transfer or interline transfer CCD sensor.

These and other objects are achieved with a control structure for stage selection in a CCD sensor that includes a well formed in a substrate and a channel formed in the well, the channel defining a channel direction. A bus structure is disposed over the channel and oriented transversely to the channel direction, the bus structure including a plurality of uniformly spaced register element sets. The plurality of uniformly spaced register element sets includes a first register element set and a plurality of remaining register element sets. The first register element set includes a first clock signal conductor and at least one other clock signal conductor. Each set of the plurality of remaining register element sets includes a first clock signal conductor and at least one other clock signal conductor. The control structure further includes a connection structure to couple together the first clock signal conductor of each of the plurality of remaining register element sets while the first clock signal conductor of the first register element set is electrically isolated from the first clock signal conductor of each of the plurality of remaining register element sets. The connection structure further couples each clock signal conductor of the at least one other clock signal conductor of the first register element set to respective clock signal conductors of each set of the plurality of remaining register element sets.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 1:
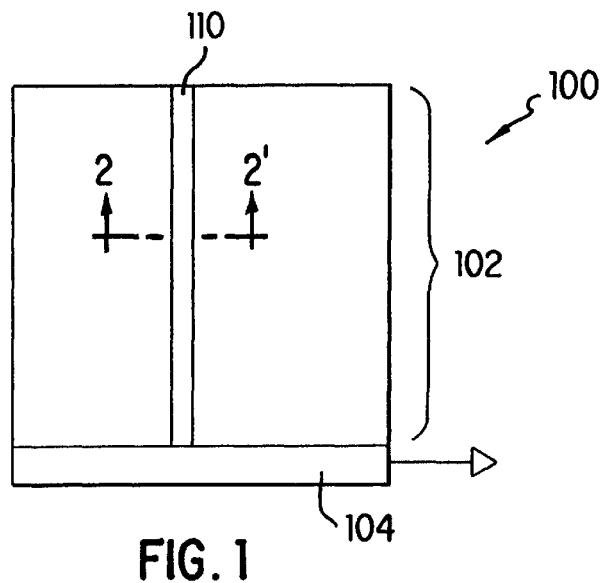
FIG. 1 is a layout diagram of the present invention.

In FIG. 1, CCD sensor 100 includes horizontal readout register 104 and imaging section 102 in which channel structure 110 has been formed. FIG. 1 depicts the location of channel structure cross section 2–2' which is shown in FIG. 2.

Figure 2:
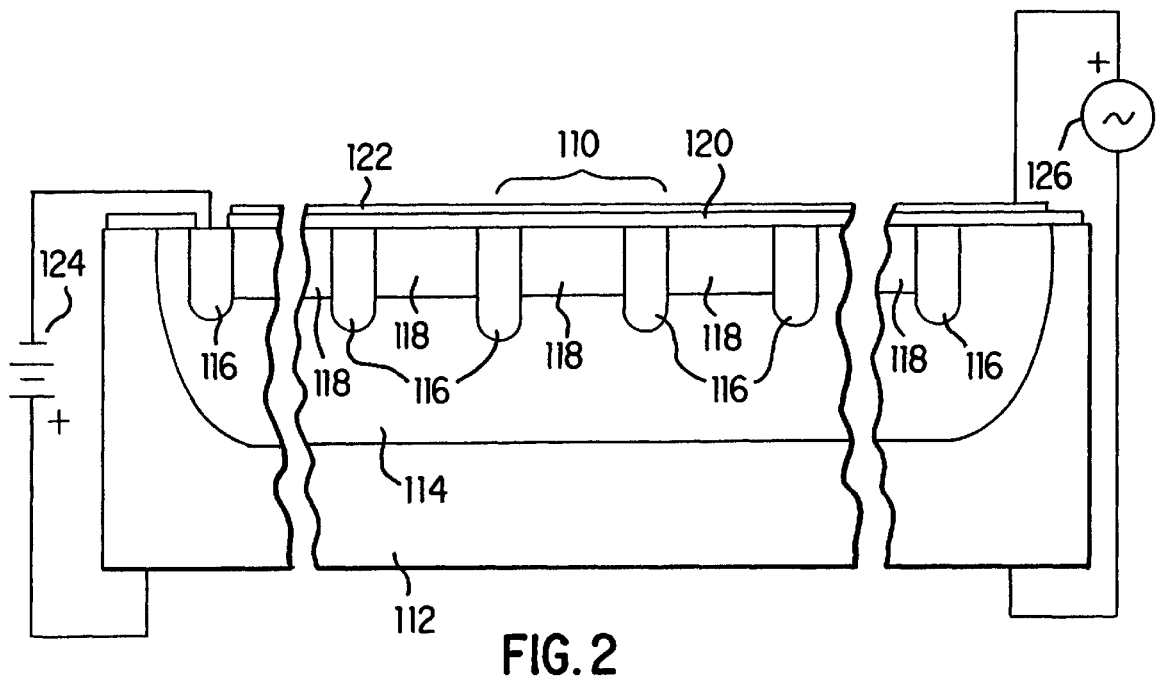
FIG. 2 is a section diagram through the diagram of FIG. 1.

In FIG. 2, well 114 (e.g., formed of a P semiconductor conductivity type) is formed in semiconductor substrate 112 (e.g., formed of an N semiconductor conductivity type). A plurality of channel stops 116 (e.g., formed of a $P^+$ semiconductor conductivity type) are formed longitudinally in a surface semiconductor region (e.g., formed of a $N^-$ semiconductor conductivity type) that is formed in well 114 so as to define a plurality of longitudinal channels 118 (e.g., formed of the surface semiconductor region of $N^-$ semiconductor conductivity type) disposed between respective channel stops 116. Bias potential 124 is applied between substrate 112 and well 114 to reverse bias the electrical junction there between. Potential is applied trough channel stops 116 or directly by contact to well 114. In either case, channel stops 116 are of the same conductivity type as well 114 so that the channel stops and the well are in electrical communication. Channels 118 are biased to be reverse biased from well 114 so that channels 118 are electrically isolated from each other and from the well and from the channel stops. Insulator 120 is formed over the channels, the channel stops and the well to surround the channels with either an insulator or a reverse biased semiconductor junction. Clock bus structure 122 is formed over insulator 120. Clock signal source 126 provides clock signals to clock bus structure 122.

Figure 3:
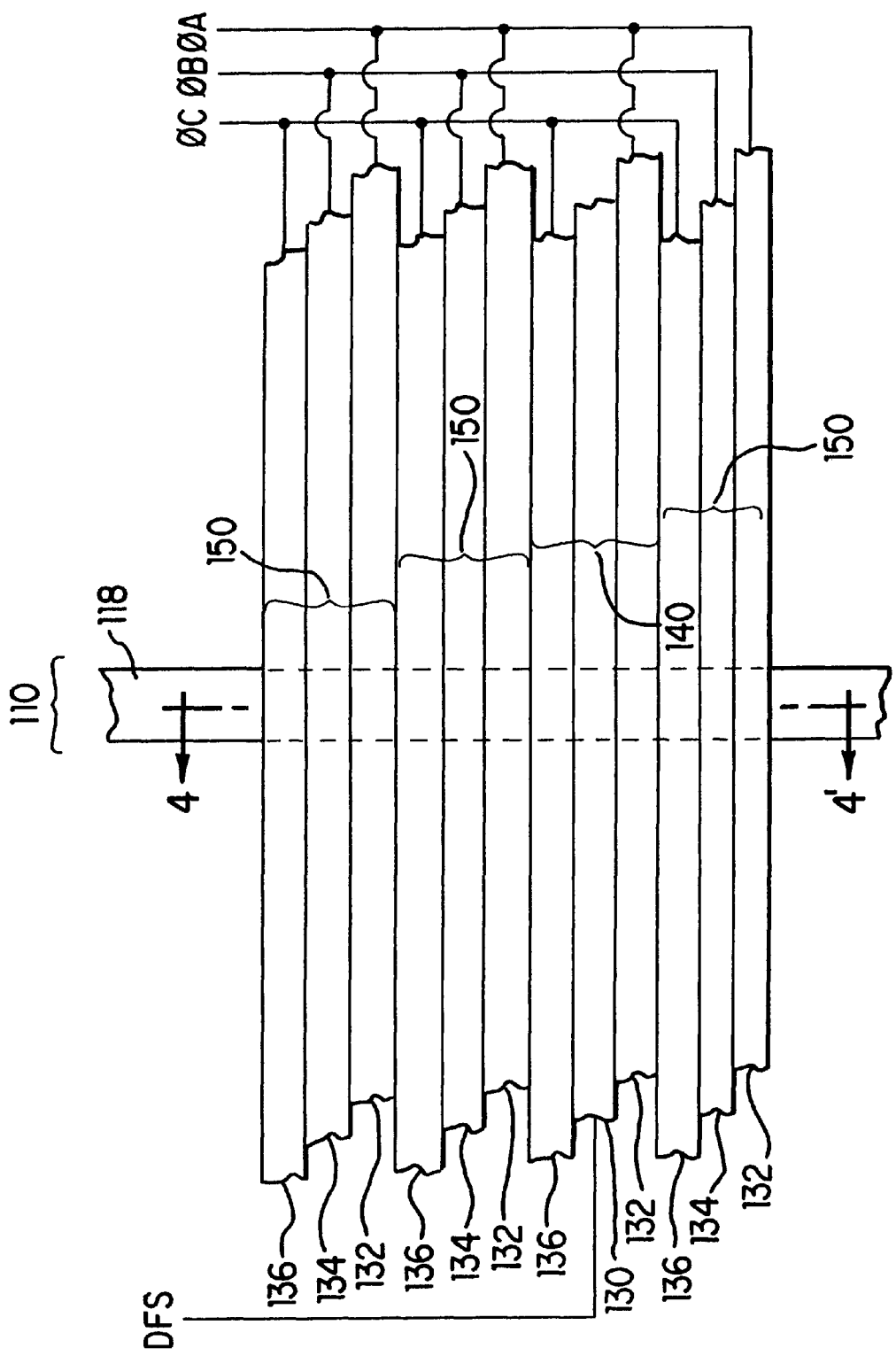
FIG. 3 is a plan view of a central portion of the diagram of FIG. 1.

FIG. 3 depicts a plan view of the clock bus structure 122 disposed over channels 118 and oriented transversely to the channel direction. Clock bus structure 122 includes a plurality of uniformly spaced register element sets including first register element set 140 and a plurality of remaining register element sets 150. Each register element set includes a plurality of clock signal conductors: two conductors for two phase clocking, three conductors for three phase clocking, four conductors for four phase clocking, etc. The clock signal conductors are preferably formed of conductively doped poly-crystalline silicon (hereinafter poly) insulated from adjacent conductors by known means.

Figure 4:
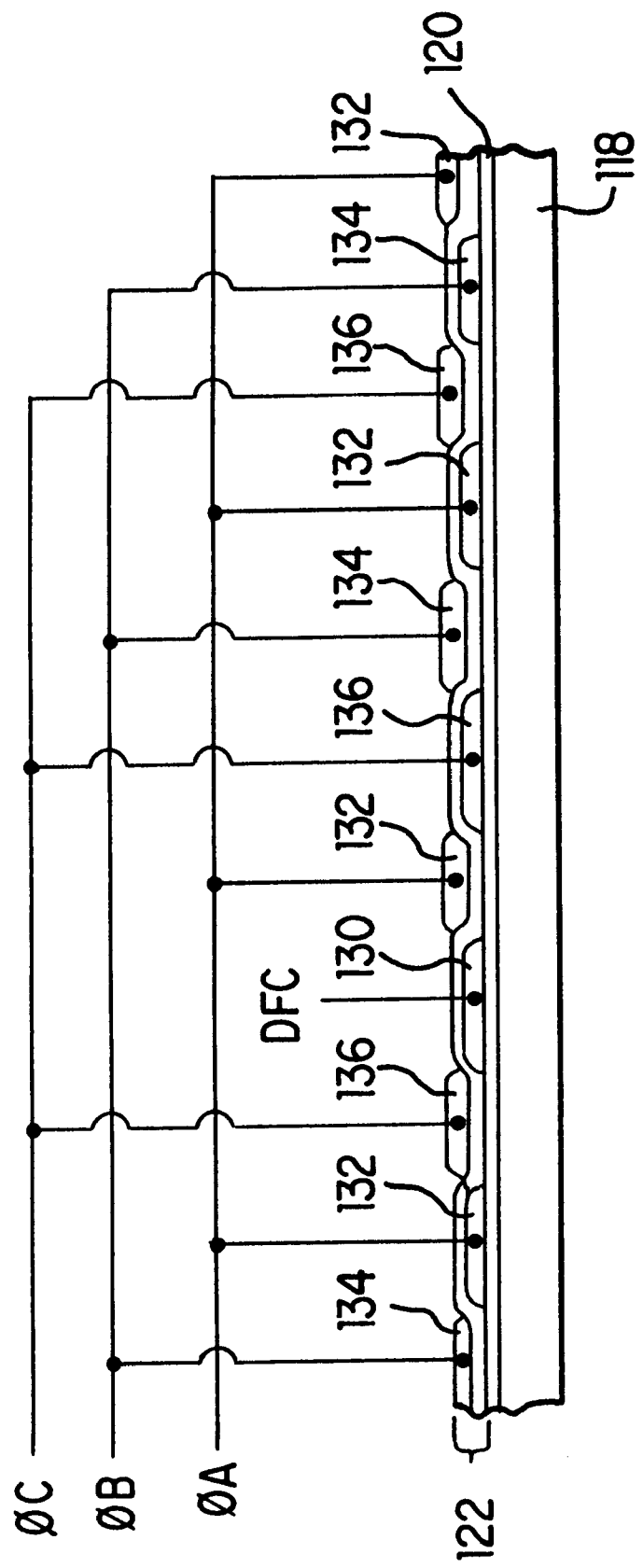
FIG. 4 is a section diagram through the diagram of FIG. 3.

In FIGS. 3 and 4, first register element set 140 includes dual function signal conductor 130 as a first clock signal conductor coupled to dual function signal DFS and at least one other clock signal conductor, for example, clock signal conductor 132 and clock signal conductor 136 coupled to clock signals $\Phi A$ and $\Phi C$, respectively, to form a three phase clocking structure. Alternatively, first register element set 140 may include dual function signal conductor 130 as a first clock signal conductor and only one other clock signal conductor to form a two phase clocking structure or it may include three or more clock signal conductors to form other multi-phase clocking structures.

Each remaining register element set of the plurality of remaining register element sets 150 includes first clock signal conductor 134 coupled to clock signal $\Phi B$. Furthermore, each remaining register element set of the plurality of remaining register element sets 150 includes at least one other clock signal conductor (for example, a first additional clock signal conductor 132, and another additional clock signal conductor 136 coupled to clock signals $\Phi A$ and $\Phi C$, respectively). Equivalent structures for two and four phase clocking structures are envisioned.

The connection structure to couple clock signals $\Phi A$, $\Phi B$ and $\Phi C$ and dual function signal DFS to clock bus structure 122 includes a connection to couple together first clock signal conductor 134 of each of the plurality of remaining register element sets 150 so as to carry clock signal $\Phi B$. However, first clock signal conductor 130 (i.e., the dual function signal conductor) of first register element set 140 is not connected to any first clock signal conductor 134 of any of the plurality of remaining register element sets 150 so that conductor 130 can carry signal DFS and be electrically isolated from signal $\Phi B$. The connection structure further includes a connection to couple each clock signal conductor of the at least one other clock signal conductor of the first register element set to respective clock signal conductors of each set of the plurality of remaining register element sets.

The plurality of remaining register element sets 150 may be regarded as including a first remaining set and a second remaining set, where first register element set 140 is disposed between the first remaining set and the second remaining set.

The CCD sensor is fabricated in a wafer and then cut or otherwise trimmed to form a die. At the edge of the die are disposed a number of terminals (e.g., aluminum pads) to which small wires are bonded to make external connections.

A CCD sensor includes a first die terminal coupled to first clock signal conductor 134 of each of the plurality of remaining register element sets 150 and a dual function die terminal coupled to first clock signal conductor 130 of first register element set 140. The CCD sensor also includes a respective other die terminals for each clock signal conductor of the at least one other clock signal conductor of first register element set 140, where each respective other die terminal is coupled to (1) a corresponding clock signal conductor of each set of the plurality of remaining register element sets 150 and (2) a corresponding clock signal conductor of first register element set 140.

A first clock signal source provides first clock signal ΦB to first clock signal conductor 134 of each of the plurality of remaining register element sets 150. The first clock signal ΦB is characterized by a clock selectable value, the clock selectable value being one of a clock high value (e.g., +5 volts) and a clock low value (e.g., 0 volts).

However, a dual function signal source provides dual function signal DFS to first clock signal conductor 130 of first register element set 140. The dual function signal DFS is characterized by a dual function selectable value, the dual function selectable value being one of the clock high value (e.g., +5 volts), the clock low value (e.g., 0 volts) and a barrier value (e.g., −3 volts) so that the clock low value is a value between the clock high value and the barrier value.

Figure 5:
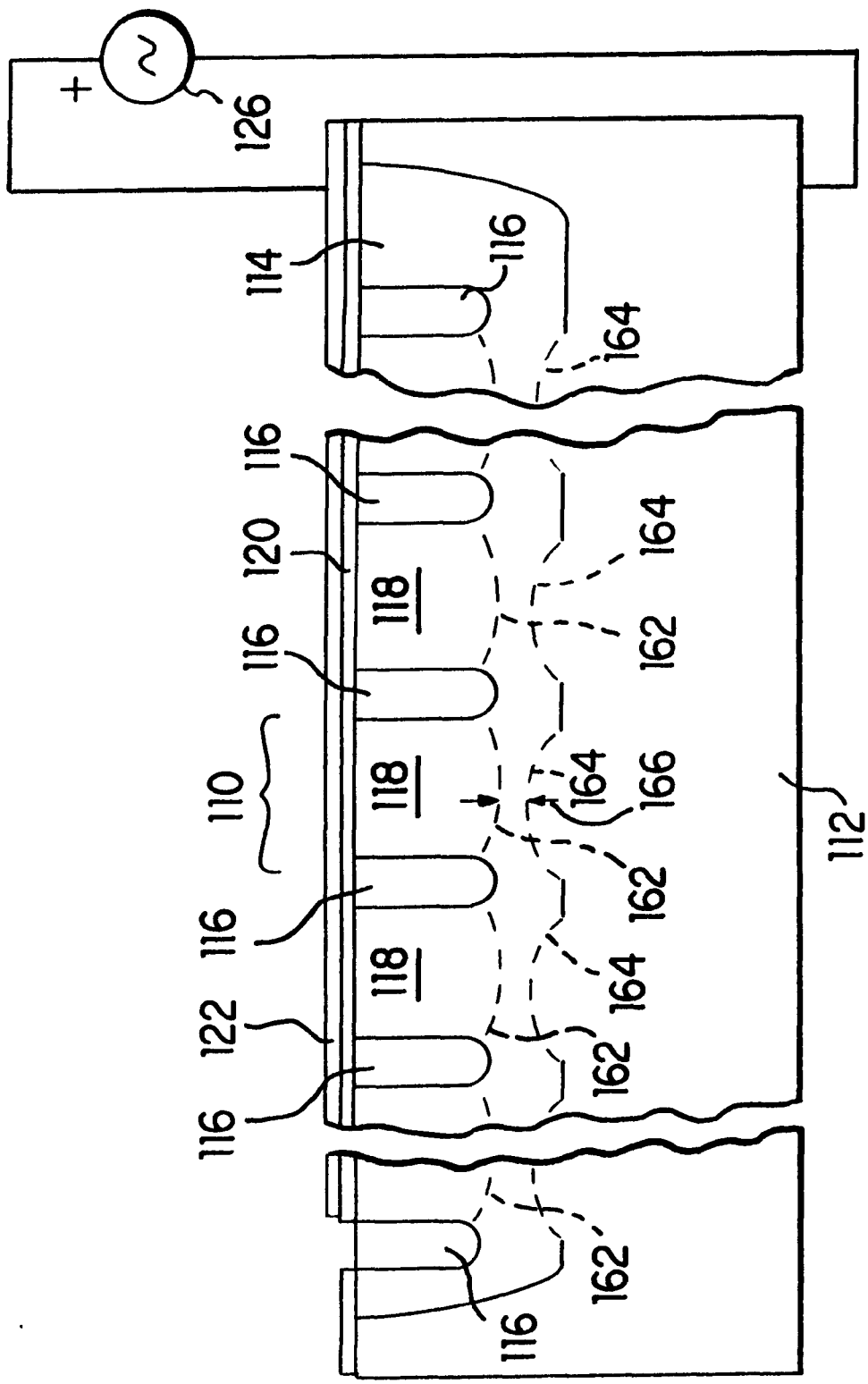
FIG. 5 is a section diagram through the diagram of FIG. 1 similar to FIG. 2, but showing electrical junctions.

In FIG. 5, a first electrical junction is defined at an electrical semiconductor junction between the channel and the well (162 of FIG. 5), and a second electrical junction (164 of FIG. 5) is defined at an electrical semiconductor junction between the well and the substrate. An inter-junction separation (166 of FIG. 5) under first clock signal conductor 130 (i.e., the dual function signal conductor) of first register element set 140 is defined between the first and second electrical junctions. A length of the inter-junction separation is controllable by the dual function selectable value. The length of the inter-junction separation is zero when the dual function selectable value is the barrier value. When the dual function selectable value is the clock high value (e.g., +5 volts), a potential well is formed under the dual function signal conductor suitable for storing a maximum design signal charge. When the dual function selectable value is the clock low value (e.g., 0 volts), a potential well of minimal capacity is formed under the dual function signal conductor, the minimal capacity well being suitable for acting as a barrier to hold charge packets in a well under an adjacent clock conductor by storing only a minimum signal charge.

Clock phase signals ΦA, ΦB and ΦC are controlled to alternate between the clock high value and the clock low value to transfer charge in the channel direction down the channel. Even dual function signal DFS alternates between the clock high value and the clock low value to transfer charge in the channel direction down the channel when the present control structure is operating in a clocking mode. Since the register element sets and conductors within the register element sets are uniformly disposed, a charge packet being transferred down the channel will not be able to detect whether it is dual function signal conductor 130 of first register element set 140 or first clock signal conductor 134 of any set of the plurality of remaining register element sets 150 that is controlling the transfer.

However, when the present control structure is operating in a shunt mode, dual function signal DFS has a value equal to the barrier value (e.g., −3 volts), and the inter-junction separation diminishes to zero so that the channel becomes in electrical communication with the substrate. Signal charge carried in the channel is then shunted into the substrate.

Figure 6:
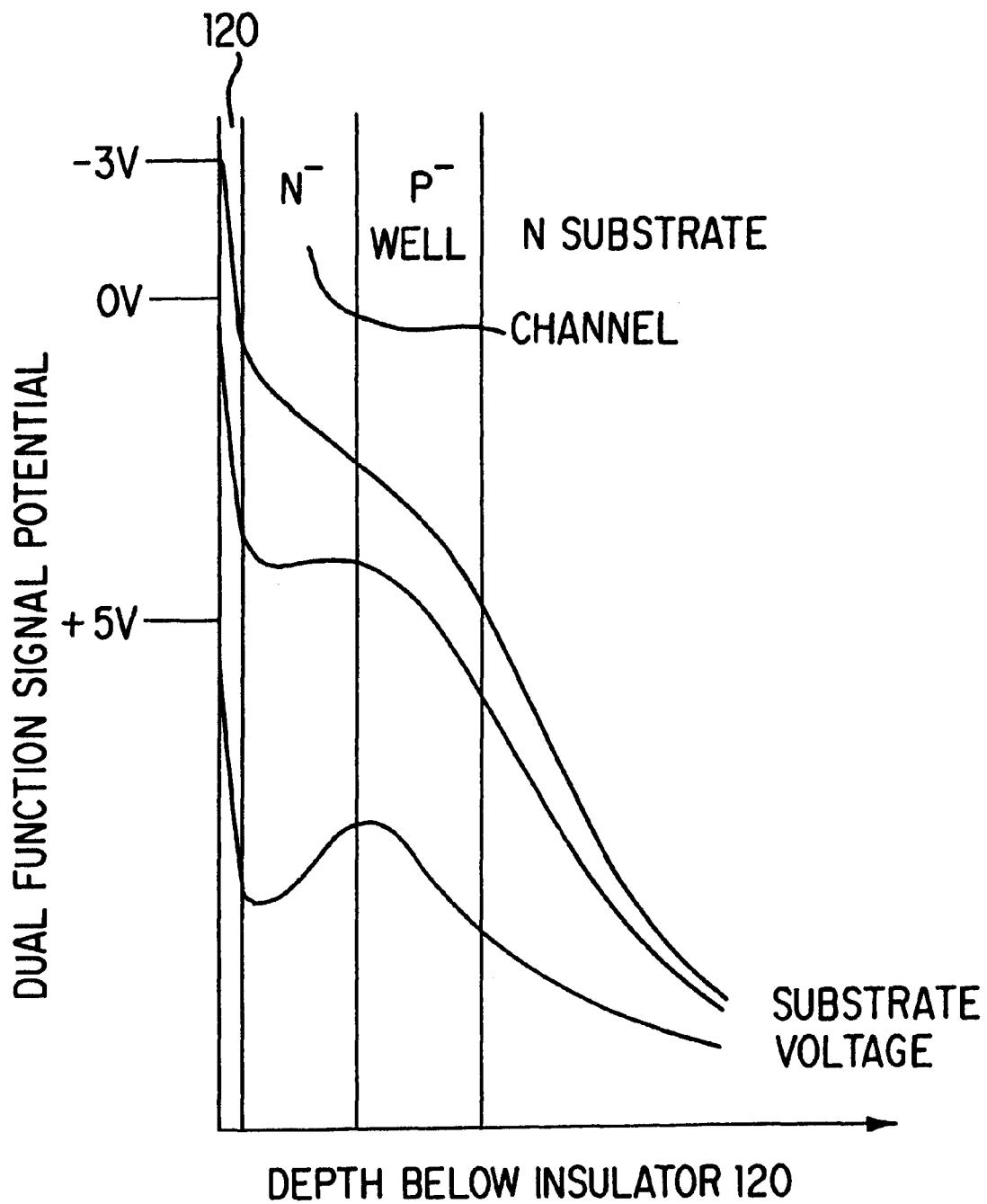
FIG. 6 is a graph depicting the relationship between the depth below dual function signal conductor 130 and the potential at that depth for three signal levels applied to dual function signal conductor 130.
Figure 7:
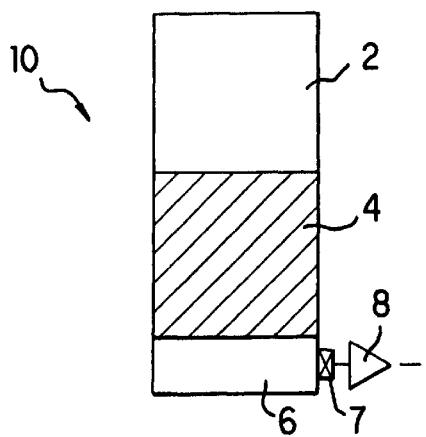
FIGS. 7–9 are layout diagrams of known sensor layouts.
Figure 8:
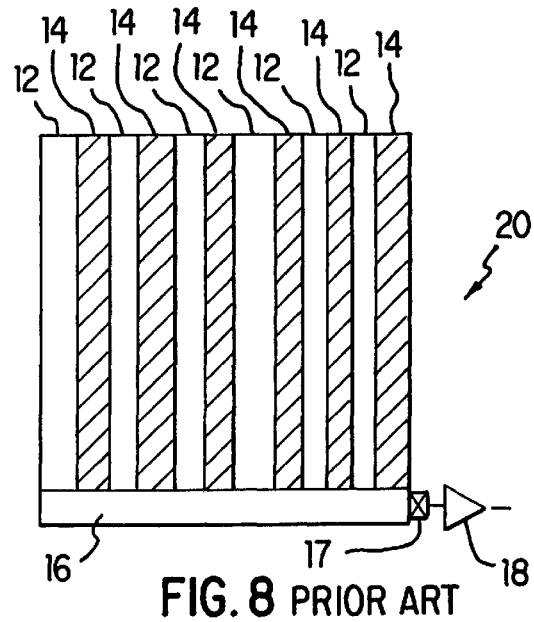
Figure 9:
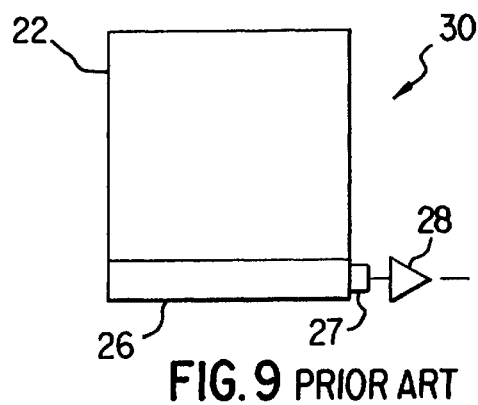

FIG. 6 is a graph of the relationship between the depth below dual function signal conductor 130 and the potential at that depth for three signal levels applied to dual function signal conductor 130: the clock high value (e.g., +5 volts), the clock low value (e.g., 0 volts) and a barrier value (e.g., −3 volts). When the clock high value is applied, a design maximum capacity well is formed as depicted in FIG. 6 as a dip in the potential within the channel depths. A local potential peak exists at the boundary between the channel and the well that acts as barrier to keep charges (e.g., electrons) from migrating into the substrate. This well (i.e., the dip) can hold charges (e.g., electrons) until sufficient charge is accumulated to make the potential in the channel more negative than the local peak of the barrier. Then, the excess charge overflows (e.g., blooms over) the local barrier and transfers into the substrate.

When the clock low value (e.g., 0 volts) is applied, a minimum capacity well is formed as depicted in FIG. 6 as a more or less flat potential zone within the channel depths. Very little, if any, charge may be held within the channel depths before the potential is sufficiently negative to overflow into the substrate.

When the barrier value (e.g., −3 volts) is applied, no charge may be held in the channel depths. As depicted in FIG. 6 as a sloped potential zone within the channel depths, an electric field exists to accelerate charge into the substrate.

To help ensure that inter-junction separation 166 (FIG. 5) is minimum at channel centers, the concentration of the dopant species used to define well 114 (FIG. 2) is thinned near the centers of each channel. This gives rise to the inter-junction separation 166 being minimum near the center of the channel and maximum near channel stops 116. Then, when the barrier value (e.g., −3 volts) is applied to dual function signal conductor 130, inter-junction separation 166 (FIG. 5) becomes zero as electrical junctions 162 and 164 make contact and charge is free to transfer from channel 118 into substrate 112 (FIG. S) under the influence of the electrical field produced by the potential gradient (i.e., slope) depicted in the channel depths in FIG. 6.

In accordance with these teachings, a CCD sensor control structure may be constructed to operate in either a clocking mode or a shunt mode. When the control structure operates in a clocking mode, the CCD sensor operates conventionally. A TDI CCD sensor integrates all of the vertical pixels before transfer to horizontal readout structure 104, and a frame transfer CCD sensor (or an interline transfer CCD sensor) transfers all of the frame image to horizontal readout structure 104 (FIG. 1).

However, when the control structure operates in a shunt mode, the CCD sensor operates differently. A TDI CCD sensor in the shunt mode integrates only as many of the vertical pixels that exist between dual function signal conductor 130 and horizontal readout structure 104, other pixels being clocked into a well beneath dual function signal conductor 130 and shunted to the substrate. In this way, the responsivity of the TDI CCD sensor may be electrically adjusted to adapt to changes in illumination conditions. In fact, multiple dual function signal conductors 130, according to these teaching, may be included in the TDI CCD sensor to provide a range of selectable responsiveness to illumination. For example, two dual function signal conductors 130 may be utilized to provide full, half or one-quarter the sensitivity to light.

A frame transfer CCD sensor (or an interline transfer CCD sensor) transfers only those pixels that exist between dual function signal conductor 130 and horizontal readout structure 104, other pixels being clocked into a well beneath dual function signal conductor 130 and shunted to the substrate. Such a structure may be used to form small images (fewer pixels) at faster rates.

Having described preferred embodiments of novel control structures for stage selection in a CCD image sensor (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by letters patent is set forth in the appended claims:

What is claimed is:

1. A control structure for a CCD sensor comprising:

a well formed in a substrate;

a channel formed in the well, the channel defining a channel direction;

a bus structure disposed over the channel and oriented transversely to the channel direction, the bus structure including a plurality of uniformly spaced register element sets, the plurality of uniformly spaced register element sets including a first register element set and a plurality of remaining register element sets, the first register element set including a first clock signal conductor and at least one other clock signal conductor, each set of the plurality of remaining register element sets including a first clock signal conductor and at least one other clock signal conductor; and a connection structure, the connection structure coupling each clock signal conductor of the at least one other clock signal conductor of the first register element set to respective clock signal conductors of each set of the plurality of remaining register element sets, the connection structure coupling together the first clock signal conductor of each of the plurality of remaining register element sets, the first clock signal conductor of the first register element set being electrically isolated from the first clock signal conductor of each of the plurality of remaining register element sets.

2. The structure of claim 1, wherein:

the plurality of remaining register element sets includes a first remaining set and a second remaining set; and the first register element set being disposed between the first remaining set and the second remaining set.

3. The structure of claim 1, further comprising:

a first die terminal coupled to the first clock signal conductor of each of the plurality of remaining register element sets;

a dual function die terminal coupled to the first clock signal conductor of the first register element set; and a respective other die terminal for each clock signal conductor of the at least one other clock signal conductor of the first register element set, each respective other die terminal being coupled to (1) a corresponding clock signal conductor of each set of the plurality of remaining register element sets and (2) a corresponding clock signal conductor of the first register element set.

4. The structure of claim 3, wherein:

the plurality of remaining register element sets includes a first remaining set and a second remaining set; and the first register element set being disposed between the first remaining set and the second remaining set.

5. The structure of claim 1, further comprising:

a first clock signal source coupled to the first clock signal conductor of each of the plurality of remaining register element sets;

a dual function signal source coupled to the first clock signal conductor of the first register element set; and a respective clock signal source for each clock signal conductor of the at least one other clock signal conductor of the first register element set, each respective clock signal source being coupled to (1) a corresponding clock signal conductor of each set of the plurality of remaining register element sets and (2) a corresponding clock signal conductor of the first register element set.

6. The structure of claim 5, wherein:

the plurality of remaining register element sets includes a first remaining set and a second remaining set; and the first register element set being disposed between the first remaining set and the second remaining set.

7. The structure of claim 1, further comprising:

a first clock signal source to provide a first clock signal coupled to the first clock signal conductor of each of the plurality of remaining register element sets, the first clock signal being characterized by a clock selectable value, the clock selectable value being one of a clock high value and a clock low value; and a dual function signal source to provide a dual function signal coupled to the first clock signal conductor of the first register element set, the dual function signal being characterized by a dual function selectable value, the dual function selectable value being one of the clock high value, the clock low value and a barrier value, the clock low value being a value between the clock high value and the barrier value.

8. The structure of claim 7, wherein:

the plurality of remaining register element sets includes a first remaining set and a second remaining set; and the first register element set being disposed between the first remaining set and the second remaining set.

9. The structure of claim 7, wherein:

the well is formed in the substrate and the channel is formed in the well so as to define an inter-junction separation under the first clock signal conductor of the first register element set;

a first end of the inter-junction separation is defined at the electrical semiconductor junction between the channel and the well;

a second end of the inter-junction separation is defined at the electrical semiconductor junction between the well and the substrate; and a length of the inter-junction separation is controllable by the dual function selectable value, the length of the inter-junction separation being zero when the dual function selectable value is the barrier value.

10. A method comprising steps of:

forming a well formed in a substrate;

forming a channel formed in the well, the channel defining a channel direction;

forming a bus structure disposed over the channel and oriented transversely to the channel direction, the bus structure including a plurality of uniformly spaced register element sets, the plurality of uniformly spaced register element sets including a first register element set and a plurality of remaining register element sets, the first register element set including a first clock signal conductor and at least one other clock signal conductor, each set of the plurality of remaining register element sets including a first clock signal conductor and at least one other clock signal conductor; and forming a connection structure, the connection structure coupling each clock signal conductor of the at least one other clock signal conductor of the first register element set to respective clock signal conductors of each set of the plurality of remaining register element sets, the connection structure coupling together the first clock signal conductor of each of the plurality of remaining register element sets, the first clock signal conductor of the first register element set being electrically isolated from the first clock signal conductor of each of the plurality of remaining register element sets.

11. The method of claim 10, wherein:

the plurality of remaining register element sets is formed to include a first remaining set and a second remaining set; and the first register element set is formed to be disposed between the first remaining set and the second remaining set.

12. The method of claim 10, further comprising steps of:

forming a first die terminal coupled to the first clock signal conductor of each of the plurality of remaining register element sets;

forming a dual function die terminal coupled to the first clock signal conductor of the first register element set; and forming a respective other die terminal for each clock signal conductor of the at least one other clock signal conductor of the first register element set, each respective other die terminal being coupled to (1) a corresponding clock signal conductor of each set of the plurality of remaining register element sets and (2) a corresponding clock signal conductor of the first register element set.

13. The method of claim 12, wherein:

the plurality of remaining register element sets is formed to include a first remaining set and a second remaining set; and the first register element set is formed to be disposed between the first remaining set and the second remaining set.

14. The method of claim 10, further comprising steps of:

coupling a first clock signal source to the first clock signal conductor of each of the plurality of remaining register element sets;

coupling a dual function signal source to the first clock signal conductor of the first register element set; and coupling each respective clock signal source for each clock signal conductor of the at least one other clock signal conductor of the first register element set to (1) a corresponding clock signal conductor of each set of the plurality of remaining register element sets and (2) a corresponding clock signal conductor of the first register element set.

15. The method of claim 14, wherein:

the plurality of remaining register element sets is formed to include a first remaining set and a second remaining set; and the first register element set is disposed between the first remaining set and the second remaining set.

16. The method of claim 10, further comprising steps of:

coupling a first clock signal source to provide a first clock signal to the first clock signal conductor of each of the plurality of remaining register element sets, the first clock signal being characterized by a clock selectable value, the clock selectable value being one of a clock high value and a clock low value; and coupling a dual function signal source to provide a dual function signal to the first clock signal conductor of the first register element set, the dual function signal being characterized by a dual function selectable value, the dual function selectable value being one of the clock high value, the clock low value and a barrier value, the clock low value being a value between the clock high value and the barrier value.

17. The method of claim 16, wherein:

the plurality of remaining register element sets is formed to include a first remaining set and a second remaining set; and the first register element set is disposed between the first remaining set and the second remaining set.

18. The method of claim 16, wherein:

the well is formed in the substrate and the channel is formed in the well so as to define an inter-junction separation under the first clock signal conductor of the first register element set;

a first end of the inter-junction separation is defined at the electrical semiconductor junction between the channel and the well;

a second end of the inter-junction separation is defined at the electrical semiconductor junction between the well and the substrate; and a length of the inter-junction separation is controllable by the dual function selectable value, the length of the inter-junction separation being zero when the dual function selectable value is the barrier value.

* * * * *